United States Patent
Grabowski et al.

(10) Patent No.: US 10,305,067 B2
(45) Date of Patent: May 28, 2019

(54) ENCAPSULATED ORGANIC CONVERSION DEVICE WITH GETTER RESERVOIR

(71) Applicant: OLEDWorks GmbH, Aachen (DE)

(72) Inventors: Stefan Peter Grabowski, Neuss (DE); Herbert Lifka, Eindhoven (NL); Peter Van De Weijer, Heeze (NL); Rainald Manfred Gierth, Köln (DE); Jens Meyer, Cologne (DE); Manfred Stephan Ruske, Kerpen (DE); Helga Hummel, Aachen (DE)

(73) Assignee: OLEDWorks GmbH (DE)

( * ) Notice: Subject to any disclaimer, the term of this patent is extended or adjusted under 35 U.S.C. 154(b) by 0 days.

(21) Appl. No.: 15/504,677

(22) PCT Filed: Aug. 4, 2015

(86) PCT No.: PCT/EP2015/067898
§ 371 (c)(1),
(2) Date: Feb. 17, 2017

(87) PCT Pub. No.: WO2016/026685
PCT Pub. Date: Feb. 25, 2016

(65) Prior Publication Data
US 2017/0279082 A1    Sep. 28, 2017

(30) Foreign Application Priority Data
Aug. 18, 2014  (EP) ..................... 14181274

(51) Int. Cl.
*H01L 51/52*  (2006.01)
*H01L 51/00*  (2006.01)
(Continued)

(52) U.S. Cl.
CPC ...... *H01L 51/5259* (2013.01); *H01L 51/0097* (2013.01); *H01L 51/448* (2013.01);
(Continued)

(58) Field of Classification Search
CPC .................................................. H01L 51/5259
(Continued)

(56) References Cited

U.S. PATENT DOCUMENTS

| 4,081,397 A | * | 3/1978 | Booe | C08K 3/22 |
| | | | | 252/194 |
| 2006/0093795 A1 | | 5/2006 | Wang et al. | |

(Continued)

FOREIGN PATENT DOCUMENTS

WO    2016/026685 A1    2/2016

OTHER PUBLICATIONS

International Search Report and Written Opinion received for PCT Application No. PCT/EP2015/067898, dated Oct. 30, 2015, 10 pages.
(Continued)

*Primary Examiner* — Caleb E Henry

(57) ABSTRACT

The invention relates to a substrate (2) for manufacturing an organic conversion device for converting electrical energy into light energy or light energy into electrical energy, wherein the substrate comprises a) an encapsulation layer (3) on the substrate, wherein the encapsulation layer includes a first inorganic layer (7), a second inorganic layer (9) and an intermediate organic layer (8), and b) a getter reservoir (6) in contact with the organic layer of the encapsulation layer. Water molecules will therefore not only be transported along the intermediate organic layer, but will also be gathered, especially absorbed, by the getter reservoir, if the encapsulation is damaged. This can slow down a transport of water molecules along a leakage path towards an organic conversion layer of the organic conversion device and hence slow down a possible degradation of the performance of the organic conversion device, if the encapsulation layer is damaged.

13 Claims, 14 Drawing Sheets

(51) Int. Cl.
  *H01L 51/44* (2006.01)
  *H01L 51/56* (2006.01)
(52) U.S. Cl.
  CPC ...... *H01L 51/5253* (2013.01); *H01L 51/5256* (2013.01); *H01L 51/56* (2013.01); *H01L 2251/303* (2013.01); *Y02E 10/549* (2013.01); *Y02P 70/521* (2015.11)
(58) Field of Classification Search
  USPC .......................................................... 257/40
  See application file for complete search history.

(56) References Cited

U.S. PATENT DOCUMENTS

2010/0163859 A1* 7/2010 Yamazaki ........... H01L 21/6835
                                                                       257/40
2013/0126837 A1   5/2013 Kim et al.
2014/0175405 A1   6/2014 Yeh et al.

OTHER PUBLICATIONS

International Preliminary Report on Patentability and Written Opinion received for PCT Application No. PCT/EP2015/067898, dated Nov. 3, 2016, 7 pages.

* cited by examiner

ENCAPSULATED ORGANIC CONVERSION DEVICE WITH GETTER RESERVOIR

FIELD OF THE INVENTION

The invention relates to a substrate for manufacturing an organic conversion device for converting electrical energy into light energy or light energy into electrical energy and to an organic conversion device comprising the substrate. The organic conversion device is preferentially an organic light emitting device or an organic photovoltaic device. The invention relates further to a method and apparatus for providing a substrate with an encapsulation layer and to a manufacturing method and apparatus for manufacturing an organic conversion device.

BACKGROUND OF THE INVENTION

Organic light emitting devices often comprise an encapsulation layer for protecting an organic light emission layer against environmental influences like moisture. If the encapsulation layer is damaged, a leakage path for water molecules may be created towards the organic light emission layer, which can lead to a degradation of the performance of the respective organic light emitting device.

SUMMARY OF THE INVENTION

It is an object of the present invention to provide a substrate for manufacturing an organic conversion device for converting electrical energy into light energy or light energy into electrical energy that allows for a slowdown of a possible degradation of the performance of the organic conversion device, if an encapsulation layer of the organic conversion device is damaged. Moreover, it is an object of the present invention to provide an organic conversion device comprising the substrate, a method and apparatus for providing a substrate with an encapsulation layer and a manufacturing method and manufacturing apparatus for manufacturing the organic conversion device.

In a first aspect of the present invention a substrate for manufacturing an organic conversion device is presented, wherein the substrate comprises:

an encapsulation layer on the substrate, wherein the encapsulation layer includes a first inorganic layer, a second inorganic layer and an intermediate organic layer, and a getter reservoir in contact with the organic layer of the encapsulation layer.

Since the substrate comprises a getter reservoir in contact with the organic layer of the encapsulation layer, water molecules will not only be transported along the intermediate organic layer, but will also be gathered, especially absorbed, by the getter reservoir, if the encapsulation is damaged. This can slow down a transport of water molecules along a leakage path towards an organic conversion layer of the organic conversion device and hence slow down a possible degradation of the performance of the organic conversion device, if the encapsulation layer is damaged.

The organic conversion device is preferentially an organic light emitting device or an organic photovoltaic device. The substrate is preferentially a flexible substrate, especially a flexible plastic substrate. The encapsulation is preferentially a thin-film encapsulation (TFE), wherein the first inorganic layer and/or the second inorganic layer may be a silicon nitride layer. Moreover, the getter reservoir may be arranged between the first and second inorganic layers of the encapsulation layer. Thus, the same inorganic layer may be used for covering the organic layer of the encapsulation layer and for covering the getter reservoir, which may lead to a simplified structure and hence to a simplified manufacturing process.

Preferentially, the substrate further comprises an electrode layer in a first region on the encapsulation layer, wherein the getter reservoir is arranged laterally relative to the electrode layer in a second region and wherein on the electrode layer in the first region on the encapsulation layer a conversion unit of the organic conversion device will be formed during the manufacturing process. By arranging the getter reservoir laterally relative to the electrode layer in the second region, the getter reservoir will very likely not interact with the light which will be generated or used by the conversion unit, thereby allowing for a high performance of the organic conversion device. In an embodiment the getter reservoir may, partly or completely, laterally enclose the electrode layer, which may lead to a further reduced, i.e. slowed down, degradation of the organic conversion device, if the encapsulation layer will be damaged. For instance, the getter reservoir may be a stripe which, completely or partly, laterally encloses the electrode layer.

The getter reservoir has the function of gathering water molecules. The getter reservoir may therefore be any component which gathers water molecules. The getter capacity, i.e. the capacity of gathering water molecules, of the getter reservoir is preferentially larger than the getter capacity that the intermediate organic layer of the encapsulation layer might have. For instance, the volume of the getter reservoir may be larger than the volume of the organic layer of the encapsulation layer, which is in contact with the getter reservoir, and/or the getter capacity of the material forming the getter reservoir may be larger than the getter capacity of the organic layer. In an embodiment the thickness of the organic layer of the encapsulation layer is within a range of 10 µm to 100 µm and the getter reservoir has a height within a range of 100 µm to 10 mm and a width within a range of 100 µm to 10 mm. The height is preferentially defined as the dimension of the getter reservoir perpendicular to the substrate and the width of the getter reservoir is preferentially defined as a dimension of the getter reservoir in a plane being parallel to the substrate. For instance, if the substrate comprises an electrode layer in a first region on the encapsulation layer, wherein the getter reservoir is arranged laterally relative to the electrode layer in a second region which at least partly surrounds the first region, the getter reservoir may be provided as a stripe which laterally at least partly surrounds the electrode layer and which may have a height within a range of 100 µm to 10 mm and a width within a range of 100 µm and 10 mm.

The getter reservoir and the organic layer may comprise the same material, especially consist of the same material, i.e. a) they may be made completely of the same material or b) they may comprise a same material and the getter reservoir or the organic layer may comprise a further material which is not used for the other of the getter reservoir and the organic layer. Using at least partly the same material for the getter reservoir and the organic layer may allow for a simplified provision of the substrate with the encapsulation layer and the getter reservoir. However, the getter reservoir and the organic layer may also only be made of different materials, i.e. they may not comprise any material in common.

In particular, the getter reservoir can comprise, especially consist of, getter particles, i.e. particles having the capacity of gathering, particularly absorbing, water molecules. In an embodiment the getter reservoir comprises getter particles in a matrix, wherein the matrix may be an organic matrix. The getter particles might be alkali oxides or earth-alkali oxides. The organic matrix and the organic layer may be made of the same material or they may be made of different materials. The getter particles can lead to a further improved water molecules gathering function of the getter reservoir and hence to a further improved reduction of a degradation of the organic conversion device, if the encapsulation layer is damaged.

In a further aspect of the present invention an organic conversion device for converting electrical energy into light energy or light energy into electrical energy is presented, wherein the organic conversion device comprises:

the substrate with the encapsulation layer and the getter reservoir as defined in claim 1, a conversion unit on the encapsulation layer, wherein the conversion unit includes a first electrode layer, a second electrode layer and an organic conversion layer in between the first and second electrode layers for converting electrical energy into light energy or light energy into electrical energy.

In another aspect of the present invention a method for providing a substrate with an encapsulation layer is presented, wherein the method comprises:

providing a substrate, providing a) an encapsulation layer with a first inorganic layer, a second inorganic layer and an organic layer in between the first and second inorganic layers on the substrate and b) a getter reservoir in contact with the organic layer.

In a preferred embodiment the providing of the encapsulation layer and the getter reservoir includes:

providing the first inorganic layer on the substrate, providing the organic layer on the first inorganic layer, providing the getter reservoir such that the getter reservoir and the organic layer are in contact, providing the second inorganic layer on the getter reservoir and on the organic layer.

Thus, the encapsulation layer and the getter reservoir in contact with the organic layer of the encapsulation layer may be provided on the substrate, before the different layers of the conversion unit are provided. This allows, for instance, producing the substrate with the encapsulation layer and the getter reservoir at a first manufacturing site, wherein then the resulting substrate can be shipped to a second manufacturing site, at which the conversion unit and possible further layers like a further encapsulation layer are provided on the substrate. At the first manufacturing site also one or several layers of the conversion unit may be provided already. For instance, a first electrode layer like an anode layer may already be provided on the encapsulation layer at the first manufacturing site such that a substrate with the encapsulation layer, the getter reservoir and the first electrode layer may be shipped to the second manufacturing site.

In further preferred embodiment the providing of the substrate and of the encapsulation layer and the getter reservoir includes:

providing the substrate with the encapsulation layer which comprises the first inorganic layer, the second inorganic layer and the organic layer in between the first and second inorganic layers, providing a first electrode layer on the encapsulation layer in a first region and not in a second region, providing an organic conversion layer on the first electrode layer and a second electrode layer on the organic conversion layer, providing a third inorganic layer on the second electrode layer and in the second region on the second inorganic layer, removing the second and third inorganic layers in the second region, providing the getter reservoir in the second region such that it is in contact with the organic layer of the encapsulation layer, providing a fourth inorganic layer on the getter reservoir.

Thus, in an embodiment the getter reservoir may be provided such that it is in contact with the organic layer within the encapsulation layer, after the different layers of the conversion unit have been provided. Preferentially, before providing the fourth inorganic layer an organic layer is provided on the third inorganic layer in the first region, in order to further improve the protection of the organic conversion layer against moisture.

In a further aspect of the present invention a manufacturing method for manufacturing an organic conversion device as defined in claim 1 is presented, wherein the manufacturing method comprises providing a substrate with an encapsulation layer as defined in claim 9 and providing a conversion unit including a first electrode layer, a second electrode layer and an organic conversion layer in between the first and second electrode layers on the encapsulation layer for converting electrical energy into light energy or light energy into electrical energy.

In an embodiment several conversion units are provided on the encapsulation layer and several getter reservoirs are provided such that each of these getter reservoirs is in contact with a respective part of the encapsulation layer on which a respective conversion unit has been provided, wherein the manufacturing method further comprises cutting out one or several conversion units including the respective parts of the encapsulation layer and of the substrate and the respective getter reservoirs in contact with the organic layers of the respective parts of the encapsulation layer. Thus, a cutting line for cutting out a conversion unit is not arranged between the conversion unit and the respective getter reservoir, in order to still have a connection between the organic layer of the respective part of the encapsulation layer and the respective getter reservoir. This can lead to a reduced proneness to environmental influences like moisture, even if the respective organic conversion device has been produced by cutting out one or several conversion units from a larger set of conversion units provided on a substrate.

In a further aspect of the present invention an apparatus for providing a substrate with an encapsulation layer is presented, wherein the apparatus comprises:

a substrate providing unit for providing a substrate, an encapsulation and getter reservoir providing unit for providing a) an encapsulation layer with a first inorganic layer, a second inorganic layer and an organic layer in between the first and second inorganic layers on the substrate and b) a getter reservoir in contact with the organic layer.

In a further aspect of the present invention a manufacturing apparatus for manufacturing an organic conversion device is presented, wherein the manufacturing apparatus comprises an apparatus for providing a substrate with an encapsulation layer as defined in claim 14 and a conversion unit providing unit for providing a conversion unit on the encapsulation layer, wherein the conversion unit includes a first electrode layer, a second electrode layer and an organic conversion layer in between the first and second electrode layers for converting electrical energy into light energy or light energy into electrical energy.

It shall be understood that the substrate of claim 1, the organic conversion device of claim 1, the method for providing a substrate of claim 9, the manufacturing method for manufacturing an organic conversion device of claim 12, the apparatus for providing a substrate of claim 14 and the manufacturing apparatus for manufacturing an organic conversion device of claim 15 have similar and/or identical preferred embodiments, in particular, as defined in the dependent claims.

It shall be understood that a preferred embodiment of the present invention can also be any combination of the dependent claims or above embodiments with the respective independent claim.

These and other aspects of the invention will be apparent from and elucidated with reference to the embodiments described hereinafter.

DETAILED DESCRIPTION OF EMBODIMENTS

Figure 1:
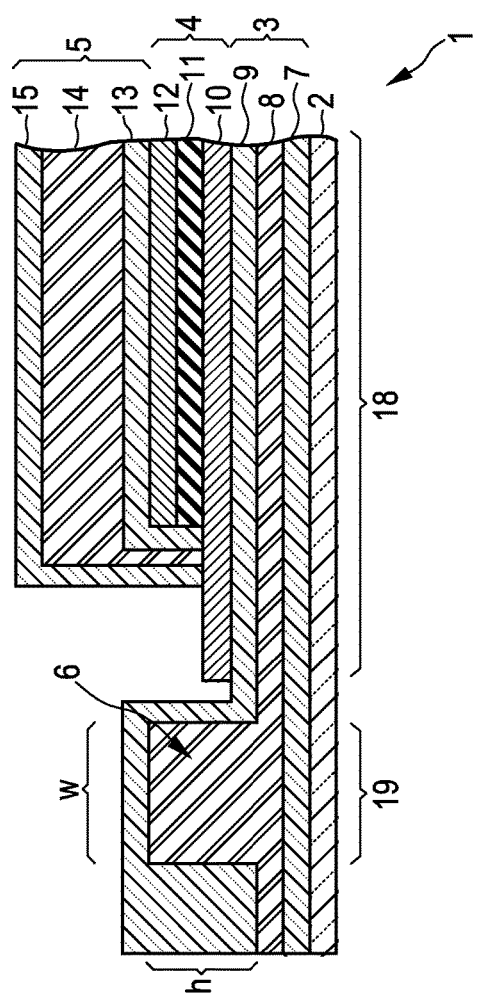
FIG. 1 illustrates schematically and exemplarily an embodiment of an organic light emitting device.

FIG. 1 illustrates schematically and exemplarily an embodiment of an organic light emitting device. The organic light emitting device 1 comprises a substrate 2, an encapsulation layer 3 on the substrate 2 and a getter reservoir 6. The encapsulation layer 3 includes a first inorganic layer 7, a second inorganic layer 9 and an intermediate organic layer 8, wherein the getter reservoir 6 is in contact with the organic layer 8 of the encapsulation layer 3.

The substrate 2 is a flexible plastic substrate and the encapsulation layer 3 is a TFE encapsulation, wherein also the getter reservoir 6 is arranged between the first and second inorganic layers 7, 9. The flexible plastic substrate may comprise, for instance, polyethylene terephthalate (PET), polyethylene naphthalate (PEN), polyether ether ketone (PEEK) and/or polyimide. However, the substrate may also comprise other materials. In particular, in another embodiment the substrate might be a flexible metal substrate like a flexible copper, aluminum or stainless steel substrate.

The organic light emitting device 1 further comprises a first electrode layer 10, which is an anode layer in this embodiment, in a first region 18 on the encapsulation layer 3. The anode layer 10 is preferentially an indium tin oxide (ITO) layer. The getter reservoir 6 is arranged laterally relative to the anode layer 10 in a second region 19. The getter reservoir 6 has a height h within a range of 100 μm to 10 mm and a width w within a range of 100 μm to 10 mm. Moreover, the thickness of the organic layer 8 is within a range of 10 μm to 100 μm. The material forming the getter reservoir 6 and the material forming the organic layer 8 of the encapsulation layer 3 may be the same or they may be different.

Preferred materials for the inorganic layers 7 and 9 are materials with good moisture barrier properties like $Si_xN_y$, $Si_xO_y$, $Si_xO_yN_z$, $Al_xO_y$, $Si_xC_y$, $Al_xN_y$, $Zr_xO_y$, $Hf_xO_y$, $Ti_xO_y$, $Zn_xO_y$ or any combinations thereof. Preferred materials for the organic layer 8 are hydrophobic organic materials that match the mechanical properties of the inorganic layer 7. In an embodiment the organic layer 8 is made of parylene or epoxy. The getter reservoir 6 may be made of the same material as the organic layer 8. However, in an embodiment the getter reservoir 6 may alternatively or additionally comprise getter particles like alkali oxide or earth-alkali oxide particles. In particular, the getter reservoir 6 may comprise the getter particles in a matrix formed by the organic material used for the organic layer 8 or formed by another organic material.

On the anode layer 10 an organic light emission layer 11 and a second electrode layer 12 being, in this embodiment, a cathode layer, are arranged, in order to form a light emission unit 4. The anode layer 10 is preferentially an ITO layer and the organic light emission layer 11 may comprise several sublayers like a hole injection layer, a hole transport layer, an emission layer which might be a double emission layer, an electron transport layer and an electron injection layer. In an embodiment the organic light emission layer 11 includes a) a 5 nm $MoO_3$ layer hole injection layer, b) a 40 nm 4,4'-Bis(N-carbazolyl)-1,1'-biphenyl (CBP) hole transport layer, c) a double emission layer comprised of 7.5 nm CBP and 7.5 nm 1,3,5-tris-phenyl-2-benzimidazolyl-benzene (TPBi) both doped with, for instance, a green phosphorescent emitter material like fac-tris-2-phenylpyridine iridium (Irppy3), wherein the dopant level might be 10 percent by weight, d) a 60 nm TPBi electron transport layer and e) a 1 nm LiF electron injection layer. In other embodiments the organic light emission layer 11 may of course comprise another sequence of sublayers. The second electrode layer 12 is preferentially a metal layer like an aluminum layer having a thickness of, for instance, 100 nm. Also the second electrode layer can of course comprise other materials like silver or ITO.

The light emission unit 4 is encapsulated by a further encapsulation layer 5 comprising a third inorganic layer 13, an organic layer 14 and a fourth inorganic layer 15. The third and fourth inorganic layers 13, 15 are preferentially formed of the same materials as the first and second inorganic layers 7, 9. However, they can of course also be made of different materials. Preferred materials for the inorganic layers 13 and 15 are materials with good moisture barrier properties like $Si_xN_y$, $Si_xO_y$, $Si_xO_yN_z$, $Al_xO_y$, $Si_xC_y$, $Al_xN_y$, $Zr_xO_y$, $Hf_xO_y$, $Ti_xO_y$, $Zn_xO_y$ or any combinations thereof. Also the organic layers 8 and 14 are preferentially made of the same material. However, they can also be made of different materials. Preferred materials for the organic layer 14 are hydrophobic organic materials that match the mechanical properties of the inorganic layer 13. In an embodiment the organic layer 14 comprises parylene or epoxy.

The anode layer 10 and the cathode layer 12 of the light emission unit 4 are electrically connected to a voltage source via electrical connections in a known way (not shown in FIG. 1), in order to apply voltage to the anode layer 10 and the cathode layer 12 such that light is emitted. In this embodiment the cathode layer is reflecting for the light generated in the organic light emission layer 11 and the anode layer 10 is transparent for this light, in order to allow the light to leave the organic light emitting device 1 through the encapsulation layer 3 and the substrate 2. In other embodiments also the cathode layer 12 may be transparent or only the cathode layer 12 may be transparent and the anode layer 10 may be reflecting.

It should be noted that FIG. 1 and also FIGS. 4 to 7 and 9 to 14 only show a part of the respective product, which should finally comprise or already comprises the getter reservoir, in order to illustrate the getter reservoir in contact with the organic layer of the encapsulation, i.e. the respective right side in the respective figure does not show an end of the respective product as indicated by the curly lines.

Figure 2:
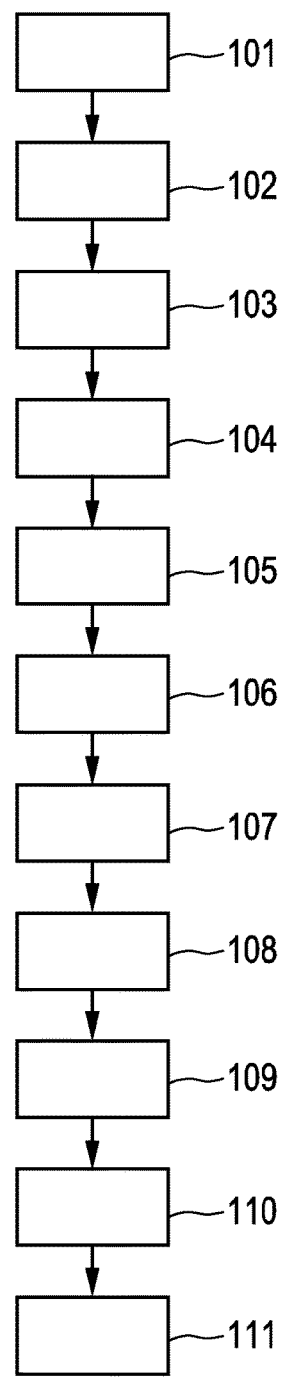
FIG. 2 shows a flowchart exemplarily illustrating an embodiment of a manufacturing method for manufacturing an organic light emitting device.
Figure 3:
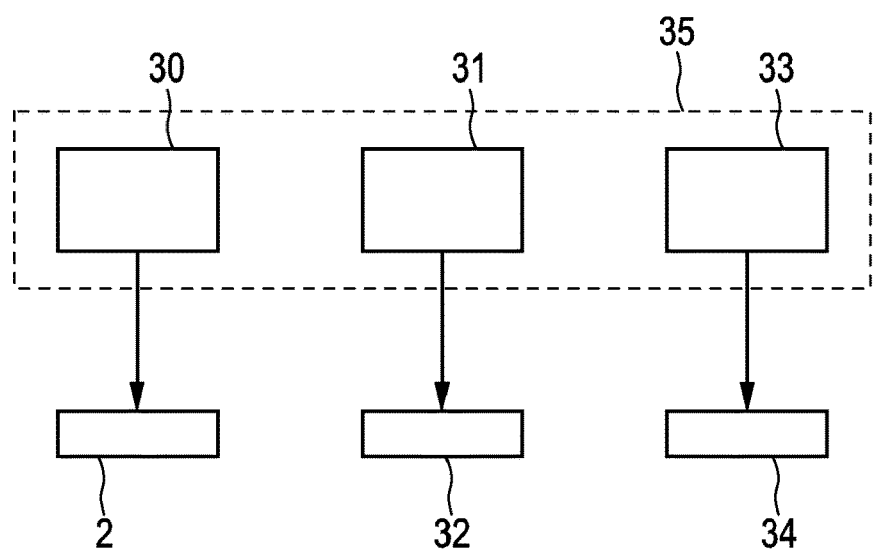
FIG. 3 shows schematically and exemplarily an embodiment of a manufacturing apparatus for manufacturing an organic light emitting device.
Figure 4:
FIGS. 4 to 7 illustrate schematically and exemplarily intermediate products, which may be produced when carrying out the manufacturing method illustrated by the flowchart shown in FIG. 2
Figure 5:
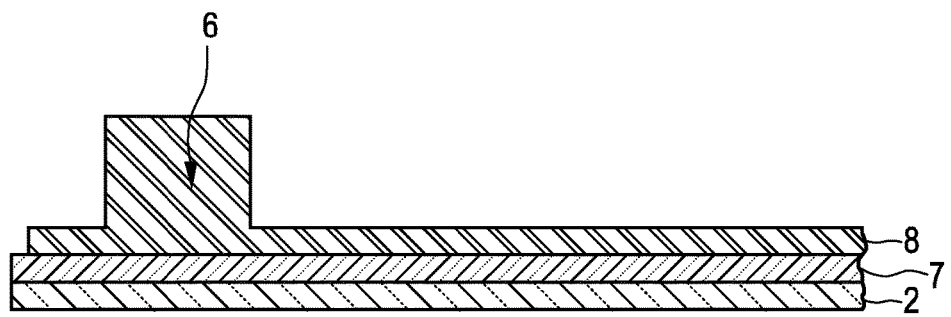
Figure 6:
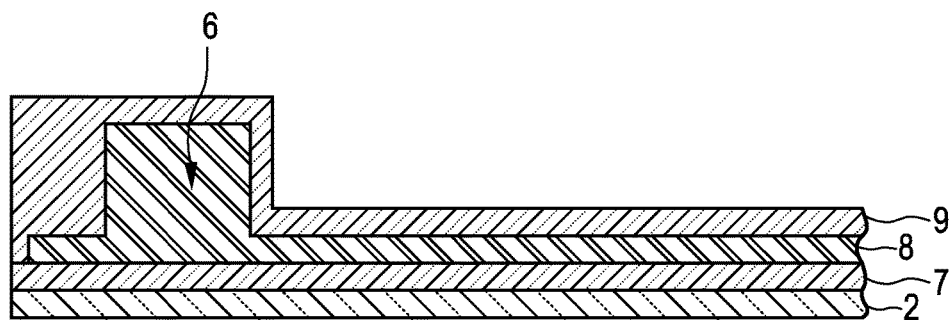
Figure 7:
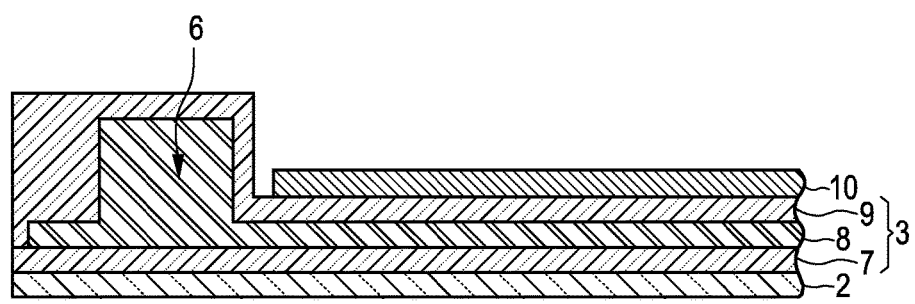

In the following a manufacturing method for manufacturing an organic conversion device will be exemplarily described with reference to a flowchart shown in FIG. 2, wherein the manufacturing method may be carried out by a manufacturing apparatus schematically and exemplarily shown in FIG. 3. In this embodiment the organic conversion device is an organic light emitting device and the manufacturing method is adapted to manufacture the organic light emitting device.

In step 101 a substrate providing unit 30 provides a substrate 2. The substrate providing unit 30 may comprise a stock of substrates, from which a substrate can, for instance, automatically or manually, be provided. The provided substrate is preferentially a flexible plastic foil.

In the following steps an encapsulation and getter reservoir providing unit 31 provides a) an encapsulation layer 3 with a first inorganic layer 7, a second inorganic layer 9 and an organic layer 8 in between the first and second inorganic layers 7, 9 on the substrate 2 and b) a getter reservoir 6 in contact with the organic layer 8.

In step 102 the first inorganic layer 7, which is preferentially a silicon nitride layer, is deposited on the substrate 2. The resulting intermediate product is schematically and exemplarily illustrated in FIG. 4.

In step 103 the organic layer 8 is provided on the first inorganic layer 7 and the getter reservoir 6 is provided such that the getter reservoir 6 and the organic layer 8 are in contact. In particular, the organic layer 8 may be printed on top of the first inorganic layer 7. The getter material forming the getter reservoir 6 may also be printed or may be evaporated. The intermediate product after having provided the organic layer 8 and the getter reservoir 6 is schematically and exemplarily shown in FIG. 5.

In step 104 the second inorganic layer 9 is provided on the getter reservoir 6 and on the organic layer 8. In particular, a silicon nitride layer preferentially forming the second inorganic layer 9 is deposited on top of the getter reservoir 6 and the organic layer 8, wherein the resulting intermediate product is schematically and exemplarily shown in FIG. 6. In FIG. 3 this intermediate product is denoted by reference number 32.

Steps 101 to 104 can be regarded as being steps of a method for providing a substrate with an encapsulation layer. Correspondingly, the substrate providing unit 30 and the encapsulation and getter reservoir providing unit 31 can be regarded as being units of an apparatus for providing a substrate with an encapsulation layer.

The following steps are performed by a conversion unit providing unit being, in this embodiment, a light emission unit providing unit 33 for providing the light emission unit 4 on the encapsulation layer 3.

In step 105 the first electrode layer 10, which is preferentially an anode layer, is deposited on the second inorganic layer 9. The resulting intermediate product is schematically and exemplarily shown in FIG. 7. In step 106 the different layers of the organic light emission layer 11 and in step 107 the second electrode layer 12 are deposited, in order to form the light emission unit 4. Then, the third inorganic layer 13 is deposited in step 108, the organic layer 14 is deposited in step 109 and the fourth inorganic layer 15 is deposited in step 110, in order to form the encapsulation layer 5 on the light emission unit 4. Steps 108 to 110 may be performed by the encapsulation and getter reservoir providing unit 30 or by another unit of the manufacturing apparatus 35. In step 111 the first and second electrode layers 10, 12 are electrically connected with the voltage source such that light can be emitted by the manufactured organic light emitting device, when a voltage is applied to the organic light emission layer 11.

Figure 8:
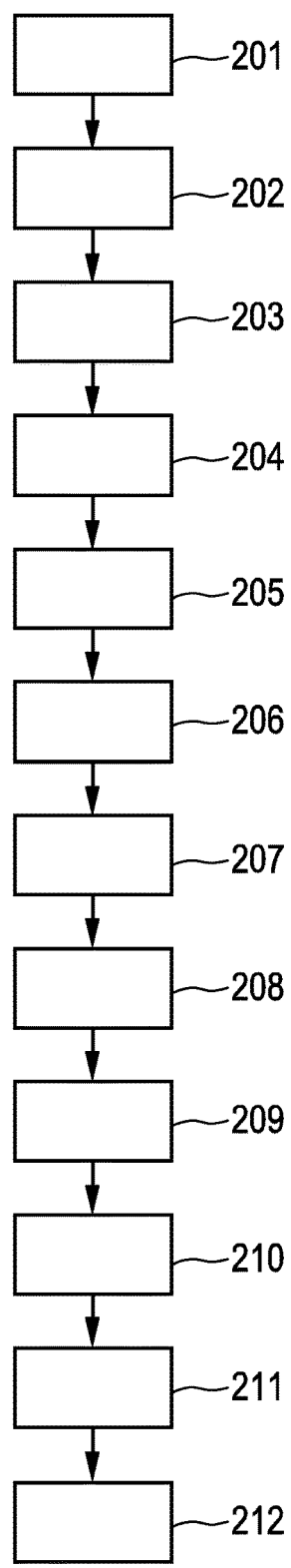
FIG. 8 shows a further flowchart exemplarily illustrating a further embodiment of a manufacturing method for manufacturing an organic light emitting device, FIGS. 9 to 14 schematically and exemplarily illustrate intermediate products, which may be produced when carrying out the manufacturing method illustrated by the flowchart shown in FIG. 8, FIG. 15 schematically and exemplarily shows a substrate with two light emission units, FIG. 16 schematically and exemplarily illustrates a further embodiment of an organic light emitting device, an FIGS. 17 and 18 schematically and exemplarily illustrate the generation of a leakage path, if a substrate is cut.
Figure 9:
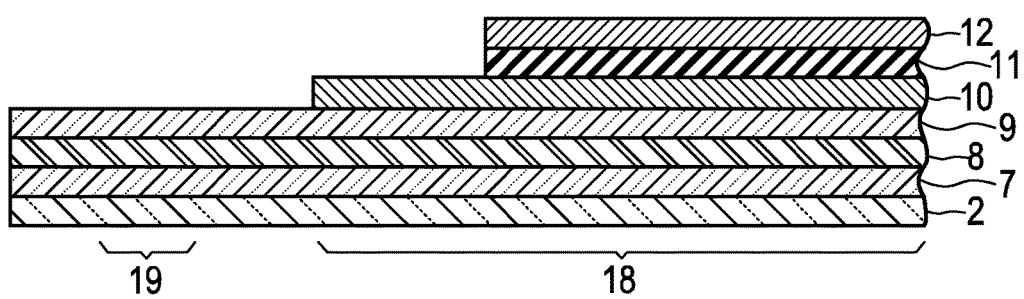
Figure 10:
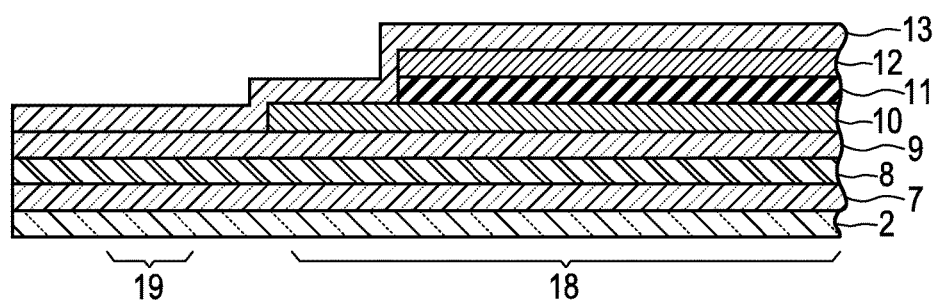

Although the manufacturing apparatus 35 has been described as comprising certain units for carrying out the steps of the manufacturing method, in other embodiments more or less units may be provided for carrying out these steps. Moreover, these steps may be performed in another order or other steps may be carried out, in order to provide an organic light emitting device comprising a substrate with an encapsulation layer, which comprises a first inorganic layer, a second inorganic layer and an organic layer in between the first and second inorganic layers, and a getter reservoir in contact with the organic layer of the encapsulation layer. Such an alternative manufacturing method will in the following be described with reference to a flowchart shown in FIG. 8.

In step 201 a substrate 2 is provided, which is preferentially a flexible plastic foil. In step 202 the first inorganic layer 7 is deposited on the substrate 2, in step 203 the organic layer 8 is deposited on the first inorganic layer 7 and in step 204 the second inorganic layer is deposited on the organic layer 8. In step 204 the first electrode layer 10, which is preferentially a transparent anode layer, is provided in a first region 18 and not in a second region 19 on the second inorganic layer 9. In step 205 the organic light emission layer 11, i.e. the different layers of this organic light emission layer 11, are deposited on the first electrode layer 10 and in step 206 the second electrode layer 12 is provided on the organic light emission layer 11. The resulting intermediate product is schematically and exemplarily illustrated in FIG. 9. In step 207 the third inorganic layer 13 is deposited on the second electrode layer 12, on a part of the first electrode layer 10 which is not covered by the organic light emission layer 11 and on the second inorganic layer 9, which is not covered by the first electrode layer 10. The resulting intermediate product is schematically and exemplarily shown in FIG. 10.

Figure 11:
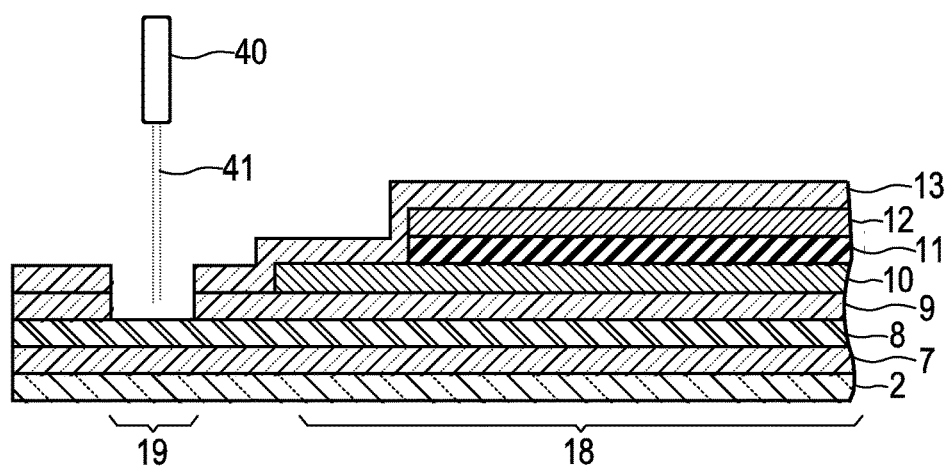

As schematically and exemplarily illustrated in FIG. 11, in step 208 the second and third inorganic layers 9, 13 are removed in the second region 19 by using, for instance, a laser 40 emitting laser light 41 for ablating the second and third inorganic layers 9, 13 in the second region 19. Thus, in step 208 the inorganic layers 9, 13 are opened up at the position, where the getter reservoir 6 should be deposited, i.e. In the second region 19.

Figure 12:
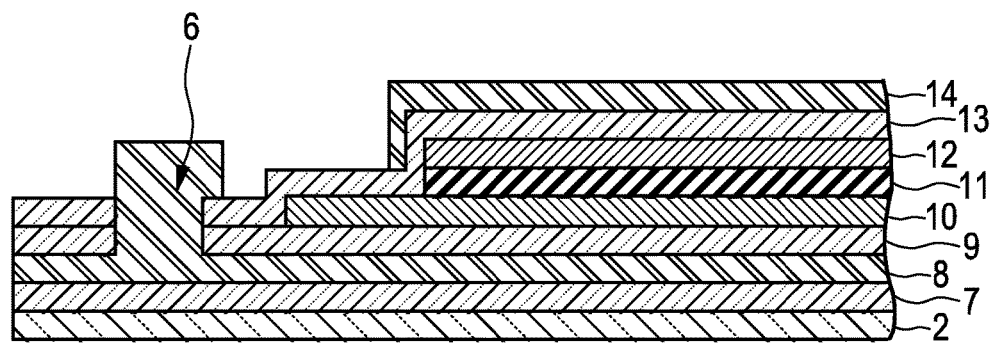
Figure 13:
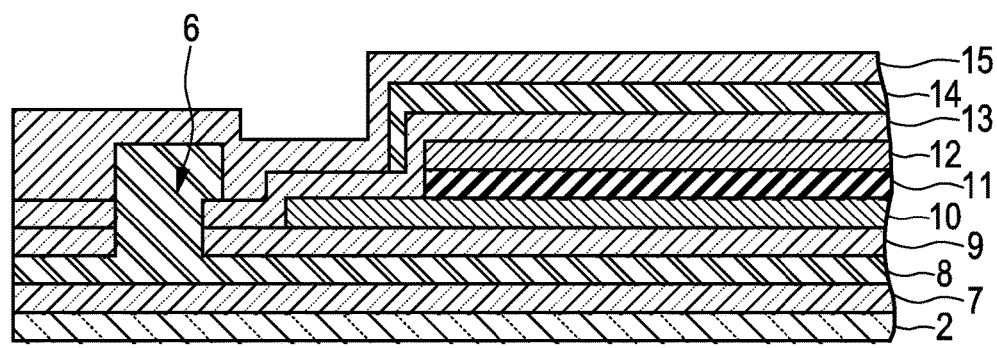

In step 209 an organic material 14 is deposited on top of the third inorganic layer 13 covering the second electrode layer 12, for instance, by printing and the getter reservoir 6 is provided, especially printed, preferably at the same time, in the second region 19 on top of the organic layer 8, such that the resulting getter reservoir 6 is in contact with the organic layer 8 as schematically and exemplarily illustrated in FIG. 12. In this embodiment the same material is used for the organic layer 14 and the getter reservoir 6. However, in another embodiment also different materials can be used. For instance, for the getter reservoir 6 a getter material can be used, which has a larger getter capacity than the material used for providing the organic layer 14 and/or for providing the organic layer 8. In step 210 a fourth inorganic layer 15 is provided on the getter reservoir 6, on the organic layer 14 and on the parts of the third inorganic layer 13, which are not covered by the getter reservoir 6 and the organic layer 14. The third inorganic layer 13, the organic layer 14 and the fourth inorganic layer 15 form the further encapsulation layer 5, which is preferably a TFE. The intermediate product, which results after step 210 has been carried out, is schematically and exemplarily shown in FIG. 13.

Figure 14:
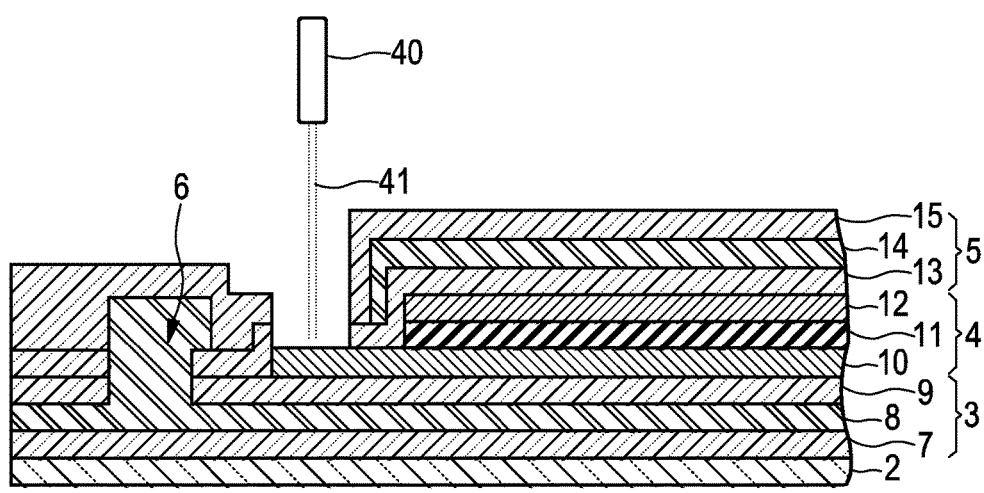

In step 211 the third and fourth inorganic layers 13, 15, which are preferentially silicon nitride layers, are opened above a part of the first electrode layer 10, which should be electrically connected, as schematically and exemplarily illustrated in FIG. 14. For performing this opening procedure a laser 40 emitting a laser beam 41 is preferentially used. Layers may also be removed on other parts of the first electrode layer 10 and/or also from parts of the second electrode layer 12, which are not shown in FIG. 14, in order to enable access to corresponding electrode contacts, which are preferentially anode and cathode contacts. Layers may also be removed by other methods than laser ablation like plasma etching. In step 212 the electrode contacts are connected to the voltage source via electrical connections, in order to apply voltage to the organic light emission layer 11.

Since steps 201 to 210 lead to an encapsulation layer on the substrate, wherein the encapsulation layer comprises two inorganic layers and an intermediate organic layer in contact with a getter reservoir, these steps can be regarded as being steps of a method for providing a substrate with an encapsulation layer.

The production of organic light emitting devices may include cutting them out of large area plastic substrates or out of a roll that is being used in a roll-to-roll process, wherein this cutting out procedure may lead to a damage of the encapsulation of the substrate and a leakage path may be opened up. In particular, when cutting out organic light emitting devices on a plastic foil, the TFE on the substrate side may be damaged such that from the sides moisture may enter the organic layer of the TFE. Water molecules may then be transported quickly over the whole area. If the water molecules find a pinhole in the respective second inorganic layer, they can access the light emission unit and create a black spot that will grow with time. The above described apparatus and method for providing a substrate with an encapsulation layer are therefore adapted such that the transport of moisture and thus the formation of black spots is significantly delayed.

For instance, on a same substrate one or several light emission units may be produced, wherein, if several light emission units are produced on a same substrate, one or several light emission units may be cut out. This cutting out is preferentially performed outside a respective getter reservoir such that an encapsulation layer on a substrate below a respective light emission unit is still in contact with a getter reservoir, after the light emission unit has been cut out. This will in the following be illustrated with reference to FIG. 15.

Figure 15:
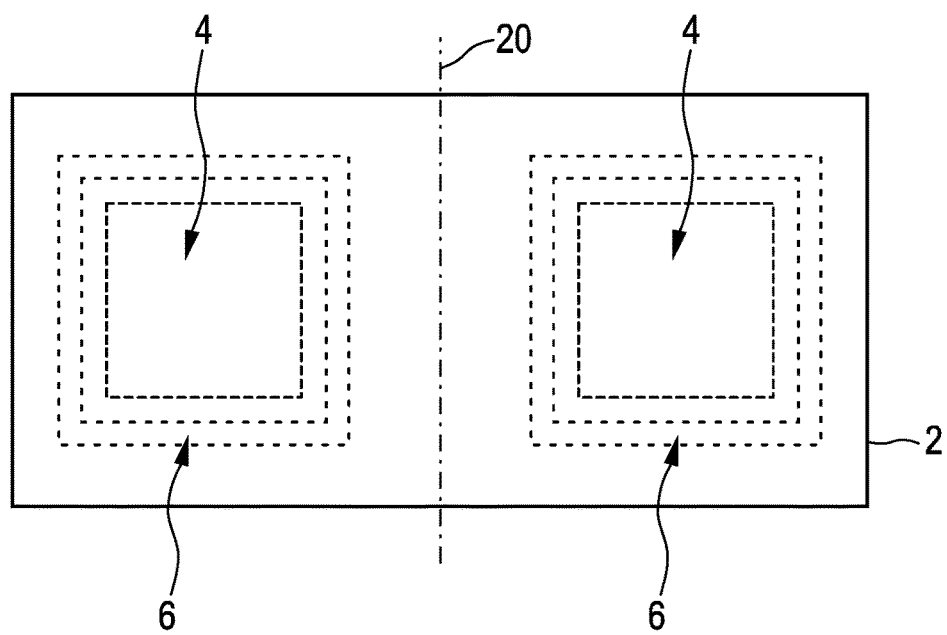
Figure 16:
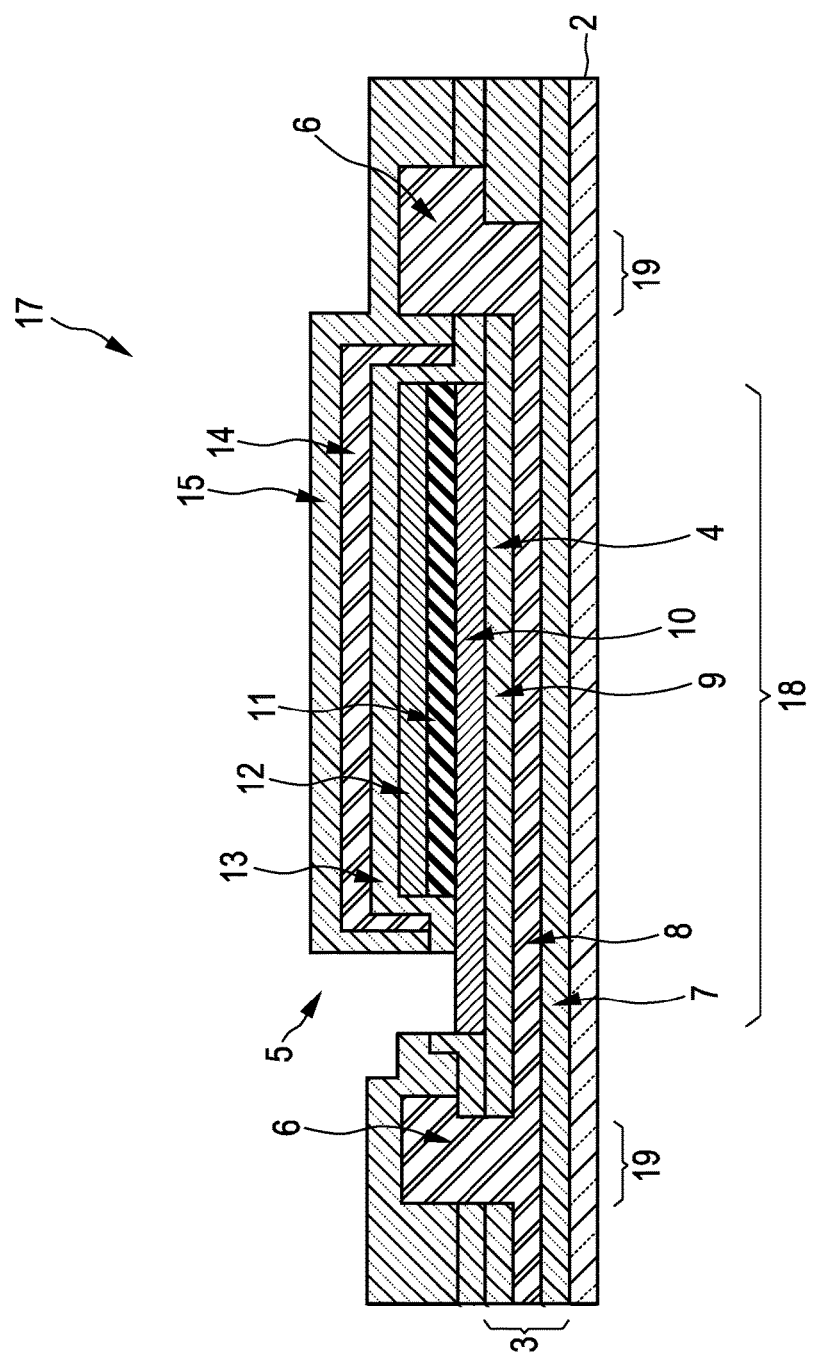

FIG. 15 schematically and exemplarily shows two light emission units 4 with laterally completely surrounding getter reservoirs 6, wherein a respective getter reservoir 6 is in contact with the organic layer of the encapsulation layer on the substrate 2 below the respective light emission unit 4. If a light emission unit 4 is cut out along the cutting line 20, the respective getter reservoir 6 is still in contact with the organic layer of the encapsulation layer on the substrate 2 below the respective light emission unit 4. Thus, the cutting procedure is preferentially performed such that the respective getter reservoir 6 is not disconnected from the respective organic layer of the encapsulation layer on the substrate 2 below the respective light emission unit 4. For instance, the organic light emitting device 1 schematically and exemplarily shown in FIG. 1 could have been cut out along a cutting line at the left edge of the organic light emitting device 1. As can be seen in FIG. 1, after this possible cutting procedure the getter reservoir 6 is still in contact with the organic layer 8 of the encapsulation layer 3 below the light emission unit 4. FIG. 16 schematically and exemplarily shows an embodiment of an organic light emitting device 17, which can be produced by the steps described above with reference to FIGS. 9 to 14 and which can have been cut out of a substrate with two or more light emission units as illustrated in FIG. 15. In FIG. 16 the cutting line is on the left side.

Figure 17:
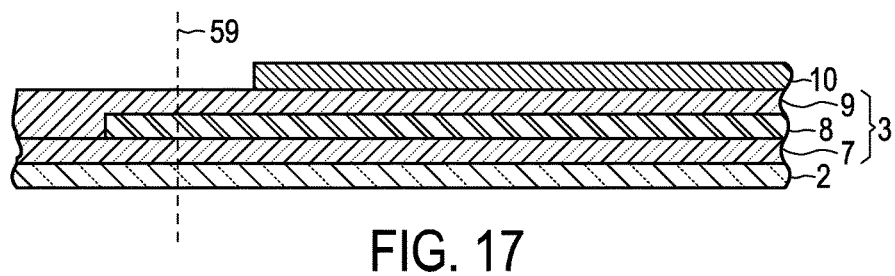
Figure 18:
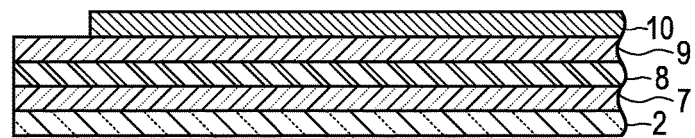

Without the getter reservoir 6 a situation as illustrated in FIGS. 17 and 18 may occur. Thus, if a substrate 2 with an encapsulation layer 3 and a first electrode layer 10 is cut out along a cutting line 59 as schematically and exemplarily shown in FIG. 17, the organic layer 8 may have an open end such that water molecules may be transported into the organic layer 8 and thus through pinholes in the inorganic layer 9 towards the light emission unit 4, which is provided on top of the first electrode layer 10, wherein the water molecules may degrade the performance of the light emission unit 4.

The above described apparatus and method for providing a substrate with an encapsulation layer are therefore preferentially used to provide a substrate with an encapsulation layer, which allows for a production of cuttable organic light emitting devices that are cut out of a larger plastic substrate and which allow for a reduction of side leakage in organic light emitting devices that have been manufactured in a roll-to-roll process. These effects rely on the reservoir with material that getters moisture. This reservoir is connected to the organic layer in the encapsulation layer being preferentially a TFE. It can be integrated into the substrate, which is preferentially a foil, by the substrate manufacturer, i.e. the substrate manufacturer can already provide a substrate with the encapsulation layer and the getter reservoir in contact with the organic layer of the encapsulation layer, or the reservoir can be applied later by an organic light emitting device manufacturer such that it is in contact with the organic layer of the encapsulation layer on the substrate.

It would be preferred if at the edge of the encapsulation layer on the substrate the organic material is buried between the two inorganic layers, in order to avoid contact with air as shown, for instance, on the left side of FIG. 17. However, for instance, in a roll-to-roll process or if several organic light emitting devices have been made on a large substrate, they have to be cut out. If the substrate, which may be a substrate foil, is cut out, a leakage path for moisture may be opened up, because after the cutting procedure the organic material may not be protected at the sides any more as schematically and exemplarily illustrated on the left side of FIG. 18. For this reason, a reservoir is applied to the substrate and brought in contact with the organic material. The reservoir, i.e. the getter reservoir, can be applied, for instance, during depositing a further encapsulation layer, which is preferentially also a TFE layer, on top of the respective light emission unit by, for example, an organic light emitting device manufacturer, for instance, as described above with reference to FIG. 8, or the reservoir may be applied beforehand by, fir example, a substrate maker, which is preferentially a foil maker, for example, as described above with reference to FIG. 2.

Preferentially, a huge getter reservoir, which is in contact with the organic barrier material of the bottom encapsulation layer which is preferentially a bottom TFE, sits next to the respective light emission unit. The getter capacity of the getter reservoir is preferentially huge compared to the getter capacity of the organic barrier material that might be along a leakage path to a pinhole in the second inorganic layer, i.e. In the inorganic layer of the encapsulation layer towards the light emission unit. The organic layer of the encapsulation may have a thickness in the several 10 µm range. The getter reservoir can have a height of several millimeters and its width can range from several 100 µm to several millimeters, depending on the available space. The getter reservoir can be made such that it encloses the respective light emission unit from all sides. When moisture enters from the side, it will propagate towards the respective light emission unit until it finds a pinhole in the second inorganic layer 9, where it may create a black spot. However, since the getter reservoir is present, the overall volume of getter material that the water molecules see on their way to the pinhole is much larger than in the case where a getter reservoir is not present.

When moisture accesses the organic layer of the encapsulation layer from an opening at the side, the moisture will be transported through the layer. However, when the moisture reaches the getter reservoir, it finds a large amount of getter material. Since the moisture transport is diffusion driven and due to the large amount of getter material, i.e. since it takes the water molecules a long time to saturate, for instance, all getter particles, there will be a diffusion gradient for the water molecules into the getter reservoir for a long time. This will direct the moisture away from the respective light emission unit into the respective getter reservoir. The organic layer serves as a quick diffusion path for the water molecules towards the getter material in the getter reservoir. The formation of black spots will therefore be delayed, especially for cut out organic light emitting devices having a damaged encapsulation layer.

The above described methods can include other and/or further steps for providing a substrate with an encapsulation layer such that a getter reservoir is in contact with the organic layer of the encapsulation layer and for manufacturing organic light emitting devices comprising this substrate. In particular, these methods can be parts of a longer process chain, wherein, for instance, more process steps can take place before or after the above described steps. For instance, an additional edge sealing step can be performed, in order to seal a leakage path at the sides of the respective organic light emitting device. A sealing material having a sealing property against moisture may be deposited on the sides of the respective organic light emitting device for providing the edge sealing. This edge sealing in combination with the getter reservoir in contact with the organic layer of the encapsulation layer on the substrate can lead to a further delayed formation of black spots. Preferred materials for the edge sealing are materials with good barrier properties like silicon nitride, aluminum oxide or metals.

The substrate with the getter reservoir in contact with the organic layer of the encapsulation layer on the substrate is preferentially used for organic light emitting devices on flexible substrates, wherein a leakage path may be generated by cutting the substrate to a smaller size. Thus, the substrate with a getter reservoir in contact with the organic layer of the encapsulation layer may be used for, for instance, cuttable organic light emitting devices, which can be cut to a desired size after processing, and for organic light emitting devices made in a roll-to-roll process.

Although in above described embodiments the substrate with the encapsulation layer and the getter reservoir is used for manufacturing an organic light emitting device, in other embodiments the substrate with the encapsulation layer and the getter reservoir may be used for manufacturing another organic conversion device like an organic photovoltaic device. The substrate with the encapsulation layer and the getter reservoir may also be used for manufacturing a hybrid organic-inorganic light emitting device, especially a hybrid organic-inorganic perovskite light emitting device.

Other variations to the disclosed embodiments can be understood and effected by those skilled in the art in practicing the claimed invention, from a study of the drawings, the disclosure, and the appended claims.

In the claims, the word "comprising" does not exclude other elements or steps, and the indefinite article "a" or "an" does not exclude a plurality.

A single unit or device may fulfill the functions of several items recited in the claims. The mere fact that certain measures are recited in mutually different dependent claims does not indicate that a combination of these measures cannot be used to advantage.

The control of the apparatus for providing a substrate with an encapsulation layer in accordance with the method for providing a substrate with an encapsulation layer and/or the control of the manufacturing apparatus for manufacturing an organic conversion device in accordance with the manufacturing method for manufacturing an organic conversion device can be implemented as program code means of a computer program and/or as dedicated hardware. However, in an embodiment the apparatuses may also be manually controlled or semi-automatically controlled.

A computer program may be stored/distributed on a suitable medium, such as an optical storage medium or a solid-state medium, supplied together with or as part of other hardware, but may also be distributed in other forms, such as via the Internet or other wired or wireless telecommunication systems.

Any reference signs in the claims should not be construed as limiting the scope.

The invention claimed is:

1. An organic conversion device for converting electrical energy into light energy or light energy into electrical energy wherein the organic conversion device has a first region and a second region, the second region being arranged laterally relative to the first region, the organic conversion device comprising:
   a substrate provided with a first encapsulation layer on top of the substrate, the first encapsulation layer including a first inorganic layer on top of the substrate, an intermediate organic layer on top of the first inorganic layer, and a second inorganic layer on top of the intermediate organic layer;

a getter reservoir in contact with the intermediate organic layer of the first encapsulation layer provided in the second region wherein the getter reservoir is arranged as a stripe;

an organic conversion unit on the first encapsulation layer, wherein the organic conversion unit includes a first electrode layer, a second electrode layer, an organic conversion layer in between the first and second electrode layers for converting electrical energy into light energy or light energy into electrical energy and the organic conversion unit is provided in the first region and not in the second region such that the first electrode layer of the organic conversion unit is laterally enclosed by the getter reservoir; and a further encapsulation layer encapsulating the organic conversion unit.

2. The organic conversion device as defined in claim 1, wherein the getter reservoir has a volume being larger than the volume of the intermediate organic layer.

3. The organic conversion device as defined in claim 1 wherein the getter reservoir comprises getter particles for gathering water molecules.

4. The organic conversion device as defined in claim 3 wherein the getter particles are alkali oxides and/or earth-alkali oxides.

5. The organic conversion device as defined in claim 1 wherein the substrate is a flexible substrate.

6. The organic conversion device as defined in claim 5, wherein the flexible substrate is a flexible plastic foil.

7. The organic conversion device as defined in claim 1 wherein the getter reservoir laterally encloses the first electrode layer of the organic conversion unit on all sides.

8. The organic conversion device as defined in claim 1 wherein the thickness of the intermediate organic layer is in the range of 10 µm to 100 µm.

9. The organic conversion device as defined in claim 1 wherein the getter reservoir has a height h within the range 100 µm to 10 mm.

10. The organic conversion device as defined in claim 1 wherein the getter reservoir has a width w within the range of 100 µm to 10 mm.

11. The organic conversion device as defined in claim 1 wherein the getter reservoir and the intermediate organic layer comprise the same material.

12. The organic conversion device as defined in claim 1 wherein the getter reservoir and the intermediate organic layer are made of different materials.

13. The organic conversion device as defined in claim 1 wherein the edge of the intermediate organic layer is buried between the two inorganic layers so that the intermediate organic layer avoids contact with air.

* * * * *